(12) United States Patent
Andideh et al.

(10) Patent No.: US 6,316,063 B1
(45) Date of Patent: Nov. 13, 2001

(54) METHOD FOR PREPARING CARBON DOPED OXIDE INSULATING LAYERS

(75) Inventors: Ebrahim Andideh, Portland; Larry Wong, Beaverton, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/465,218

(22) Filed: Dec. 15, 1999

(51) Int. Cl.[7] .................................................. H05H 1/24
(52) U.S. Cl. .......................... 427/577; 427/58; 427/249.1; 427/249.15; 427/255.28; 427/255.37; 427/255.39; 427/578; 427/585
(58) Field of Search ...................................... 427/577, 578, 427/585, 58, 249.1, 249.15, 255.28, 255.37, 255.39, 255.393

(56) References Cited

U.S. PATENT DOCUMENTS 4,845,054 * 7/1989 Mitchener .
5,908,672 * 6/1999 Ryu et al. .

* cited by examiner

*Primary Examiner*—Bernard Pianalto
(74) *Attorney, Agent, or Firm*—Fish & Richardson P.C.

(57) ABSTRACT

A method for forming carbon doped oxide layers by chemical vapor deposition using a source gas that includes: (a) an alkyl-alkoxysilane having the formula $(R^1)_n(R^2O)_{4-n}Si$ where $R^1$ and $R^2$ are lower alkyl groups and n is an integer between 0 and 3, inclusive, with the proviso that when $R^1$ and $R^2$ are methyl groups, n is not equal to 2; (b) a fluorinated alkoxysilane having the formula $(R^3O)_nSiF_{4-n}$ where $R^3$ is a lower alkyl group and n is an integer between 1 and 3, inclusive, or a combination thereof.

18 Claims, No Drawings

METHOD FOR PREPARING CARBON DOPED OXIDE INSULATING LAYERS

FIELD OF THE INVENTION

The present invention relates to a method for preparing carbon doped oxide insulating layers, and semiconductor devices incorporating such layers.

BACKGROUND OF THE INVENTION

Semiconductor devices include metal layers that are insulated from each other by dielectric layers. As device features shrink, reducing the distance between the metal layers, capacitance increases. To address this problem, insulating materials that have a relatively low dielectric constant are being used in place of silicon dioxide (and other materials that have a relatively high dielectric constant) to form the dielectric layer that separates the metal lines.

One material that may be used to form such a low k dielectric layer is carbon doped oxide. Using this material instead of silicon dioxide to separate metal lines may yield a device having reduced propagation delay, cross-talk noise, and power consumption. Carbon doped oxides have been prepared by plasma enhanced chemical vapor deposition ("PECVD") using gases that provide a source of silicon, oxygen, and carbon. Examples of source gases that have been used included dimethylmethoxysilane and alkyl silanes such as methylsilane, trimethylsilane, and tetramethylsilane. While these source gases produce carbon doped oxides having acceptable k values, it would be desirable to produce carbon doped oxides having even lower k values.

SUMMARY OF THE INVENTION

The present invention is a method for forming carbon doped oxide layers by chemical vapor deposition using a source gas that includes:

(a) an alkyl-alkoxysilane having the formula $(R^1)_n(R^2O)_{4-n}Si$ where $R^1$ and $R^2$ are lower alkyl groups, e.g., having between 1 and 4 carbon atoms, inclusive, and n is an integer between 0 and 3, inclusive, with the proviso that when $R^1$ and $R^2$ are methyl groups, n is not equal to 2; or (b) a fluorinated alkoxysilane having the formula $(R^3O)_nSiF_{4-n}$ where $R^3$ is a lower alkyl group, e.g., having between 1 and 4 carbon atoms, inclusive, and n is an integer between 1 and 3, inclusive.

These source gases may be used alone or in combination with each other. They may also be used in combination with other gases that provide a source of oxygen, silicon, and/or carbon.

DETAILED DESCRIPTION OF THE INVENTION

In the method of the present invention, a carbon doped oxide insulating layer is formed on a substrate. The substrate may be any surface, generated when making a semiconductor device, upon which the carbon doped oxide insulating layer may be formed. The substrate may include, for example, active and passive devices that are formed on a silicon wafer such as transistors, capacitors, resistors, diffused junctions, gate electrodes, local interconnects, etc. The substrate may also include insulating materials (e.g., silicon dioxide, either undoped or doped phosphorus (PSG) or boron and phosphorus (BPSG); silicon nitride; silicon oxynitride; silicon carbide; carbon doped oxide; an organic containing silicon oxide; or a polymer) that separate such active and passive devices from conductive layers that are formed on top of them, and may include various types of conductive layers.

The carbon doped oxide layer is formed on top of the substrate. Preferably, it contains between about 5 and about 50 atomic % carbon. It is formed using chemical vapor deposition techniques such as PECVD and a gaseous feed that provides a source of carbon, oxygen, and silicon.

In one embodiment, the source gas includes an alkyl-alkoxysilane having the formula $(R^1)_n(R^2O)_{4-n}Si$ where $R^1$ and $R^2$ are lower alkyl groups, e.g., having between 1 and 4 carbon atoms, inclusive, and n is an integer between 0 and 3, inclusive, with the proviso that when $R^1$ and $R^2$ are methyl groups, n is not equal to 2. Examples of such materials include methyltrimethoxysilane, tetramethoxysilane, trimethylmethoxysilane, and combinations thereof.

In another embodiment, the source gas includes a fluorinated alkoxysilane having the formula $(R^3O)_nSiF_{4-n}$ where $R^3$ is a lower alkyl group, e.g., having between 1 and 4 carbon atoms, inclusive, and n is an integer between 1 and 3, inclusive. Examples of such materials include fluorinated methoxysilane, fluorinated ethoxysilane, and combinations thereof.

These source gases may be used alone or in combination with each other. They may also be used in combination with other gaseous sources of carbon, oxygen, and/or silicon. Examples include hydrocarbon gases such as methane, ethane, etc.; alkylsilanes such as methyl, dimethyl, trimethyl, and tetramethylsilane; and dimethyldimethoxysilane.

The operating conditions for the PECVD reactor, including temperature, pressure, RF, and power, are selected to produce a carbon doped oxide layer having the requisite k value and thickness. Typical thicknesses range from about 300 to about 3,000 nanometers. The k values are preferably no greater than 2.5. In general, it is desirable to obtain a k value as low as possible.

Following deposition of the carbon doped oxide layer, it may be desirable in some cases to cure the layer to outgas volatile species, e.g., hydrogen and loosely bonded organic components. Additional layers may then be formed on the carbon doped oxide layer using conventional semiconductor fabrication processes.

Although the foregoing description has specified certain steps, materials, and equipment that may be used in such a method, those skilled in the art will appreciate that many modifications and substitutions may be made. Accordingly, it is intended that all such modifications, alterations, substitutions, and additions be considered to fall within the spirit and scope of the invention as defined by the appended claims.

What is claimed is:

1. A method of forming a carbon doped oxide insulating layer on a substrate comprising subjecting the substrate to a chemical vapor deposition process using a source gas comprising an alkyl-alkoxysilane having the formula $(R^1)_n(R^2O)_{4-n}Si$ where $R^1$ and $R^2$ are lower alkyl groups and n is an integer between 0 and 3, inclusive, with the proviso that when $R^1$ and $R^2$ are methyl groups, n is not equal to 2, to form a carbon doped oxide insulating layer on the substrate.

2. The method of claim 1 wherein the chemical vapor deposition process is plasma enhanced chemical vapor deposition.

3. The method of claim 1 wherein $R^1$ and $R^2$, independently, have between 1 and 4 carbon atoms, inclusive.

4. The method of claim 1 wherein the source gas comprises methyltrimethoxysilane.

5. The method of claim 1 wherein the source gas comprises tetramethoxysilane.

6. The method of claim 1 wherein the source gas comprises trimethylmethoxysilane.

7. The method of claim 1 wherein the source gas further comprises a gas selected from the group consisting of hydrocarbons, alkylsilanes, dimethyldimethoxysilane, and combinations thereof.

8. The method of claim 1 wherein the carbon doped oxide layer has a k value no greater than 2.5.

9. The method of claim 1 wherein the carbon doped oxide layer has a thickness ranging from 300 nanometers to 3,000 nanometers.

10. A method of forming a carbon doped oxide insulating layer on a substrate comprising subjecting the substrate to a chemical vapor deposition process using a source gas comprising a fluorinated alkoxysilane having the formula $(R^3O)_nSiF_{4-n}$ where $R^3$ is a lower alkyl group and n is an integer between 1 and 3, inclusive, to form a carbon doped oxide insulating layer on the substrate.

11. The method of claim 10 wherein the chemical vapor deposition process is plasma enhanced chemical vapor deposition.

12. The method of claim 10 wherein $R^3$ has between 1 and 4 carbon atoms, inclusive.

13. The method of claim 10 wherein the source gas comprises fluorinated methoxysilane.

14. The method of claim 10 wherein the source gas comprises fluorinated ethoxysilane.

15. The method of claim 10 wherein the source gas further comprises a gas selected from the group consisting of hydrocarbons, alkylsilanes, dimethyldimethoxysilane, and combinations thereof.

16. The method of claim 10 wherein the carbon doped oxide layer has a k value no greater than 2.5.

17. The method of claim 10 wherein the carbon doped oxide layer has a thickness ranging from 300 nanometers to 3,000 nanometers.

18. A method of forming a carbon doped oxide insulating layer on a substrate comprising subjecting the substrate to a plasma enhanced chemical vapor deposition process using a source gas comprising a gas selected from the group consisting of:
  (a) an alkyl-alkoxysilane having the formula $(R^1)_n(R^2O)_{4-n}Si$ where $R^1$ and $R^2$ are lower alkyl groups and n is an integer between 0 and 3, inclusive, with the proviso that when $R^1$ and $R^2$ are methyl groups, n is not equal to 2;
  (b) a fluorinated alkoxysilane having the formula $(R^3O)_nSiF_{4-n}$ where $R^3$ is a lower alkyl group and n is an integer between 1 and 3, inclusive; and combinations thereof,
    to produce a carbon doped oxide layer having a k value no greater than 2.5.

* * * * *